US011180361B2

(12) United States Patent
Fueldner et al.

(10) Patent No.: US 11,180,361 B2
(45) Date of Patent: Nov. 23, 2021

(54) MEMS DEVICE AND METHOD FOR PRODUCING THE SAME

(71) Applicant: Infineon Technologies AG, Neubiberg (DE)

(72) Inventors: Marc Fueldner, Neubiberg (DE); Arnaud Walther, Unterhaching (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/783,587

(22) Filed: Feb. 6, 2020

(65) Prior Publication Data
US 2020/0290864 A1      Sep. 17, 2020

(30) Foreign Application Priority Data

Mar. 15, 2019   (EP) ..................... 19163178

(51) Int. Cl.
| | |
|---|---|
| *H04R 1/00* | (2006.01) |
| *B81B 3/00* | (2006.01) |
| *H04R 1/04* | (2006.01) |
| *H04R 19/00* | (2006.01) |
| *H04R 19/04* | (2006.01) |
| *H04R 31/00* | (2006.01) |

(52) U.S. Cl.
CPC .............. *B81B 3/001* (2013.01); *H04R 1/04* (2013.01); *H04R 19/005* (2013.01); *H04R 19/04* (2013.01); *H04R 31/003* (2013.01); *B81B 2201/0257* (2013.01); *B81B 2203/0127* (2013.01); *B81B 2203/04* (2013.01); *H04R 2201/003* (2013.01)

(58) Field of Classification Search
CPC ........ H04R 1/04; H04R 19/04; H04R 19/005; H04R 31/003; H04R 2201/003; B81B 3/001; B81B 3/0016; B81B 3/0072; B81B 2201/0257; B81B 2203/04; B81B 2203/0127; B81B 2203/053; B81B 7/02; B81C 1/00166
See application file for complete search history.

(56) References Cited

U.S. PATENT DOCUMENTS

| | | | |
|---|---|---|---|
| 2010/0175477 A1* | 7/2010 | Kasai ..................... | G01H 11/06 |
| | | | 73/649 |
| 2012/0055769 A1 | 3/2012 | Naito et al. | |
| 2012/0082325 A1 | 4/2012 | Sakurauchi et al. | |
| 2013/0221453 A1 | 8/2013 | Dehe et al. | |
| 2015/0060955 A1 | 3/2015 | Chen | |
| 2015/0264462 A1* | 9/2015 | Okugawa ............... | H04R 19/04 |
| | | | 381/174 |
| 2015/0289046 A1 | 10/2015 | Dehe et al. | |
| 2019/0071305 A1 | 3/2019 | Strasser et al. | |

* cited by examiner

*Primary Examiner* — Matthew A Eason
(74) *Attorney, Agent, or Firm* — Slater Matsil, LLP

(57) ABSTRACT

A MEMS device includes a first electrode structure and a second electrode structure forming a capacitive sensing arrangement. The MEMS device includes a plurality of anti-stiction bumps arranged between the first electrode structure and the second electrode structure at a corresponding plurality of locations. The plurality of locations being projected into a main surface of the second electrode structure is distributed so as to comprise a first distribution density in a first main surface region of the main surface and so as to comprise second, different distribution density in a second main surface region of the main surface, the second main surface region being delimited from the first main surface region.

17 Claims, 15 Drawing Sheets

1400

```
┌─────────────────────────────────────────┐
│  Forming a capacitive sensing arrangement with a first  │ ~1410
│  electrode structure and a second electrode structure;  │
└─────────────────────────────────────────┘
                     │
┌─────────────────────────────────────────┐
│  Arranging a plurality of anti-stiction bumps between   │
│  the first electrode structure and the second electrode │
│  structure at a corresponding plurality of locations such│
│  that the plurality of locations being projected into a main│
│  surface of the second electrode structure is distributed│ ~1420
│  so as to comprise a first distribution density in a first│
│  main surface region of the main surface and so as to   │
│  comprise a second, different distribution density in a │
│  second main surface region of the main surface, the    │
│  second main surface region being delimited from the    │
│  first main surface region                              │
└─────────────────────────────────────────┘
```

Fig. 14

MEMS DEVICE AND METHOD FOR PRODUCING THE SAME

This application claims the benefit of European Patent Application No. 19163178, filed on Mar. 15, 2019, which application is hereby incorporated herein by reference.

TECHNICAL FIELD

The present disclosure is related to a MEMS device and to a method for producing a MEMS device. The present disclosure further relates to a mechanically robust microphone.

BACKGROUND

Microelectromechanical systems (MEMS) using a deflectable membrane may be implemented for a plurality of use cases such as microphones, loudspeakers, pressure sensors or the like. To prevent stiction between the membrane structure and a backplate structure, anti-stiction bumps may be arranged between the membrane structure and the backplate structure.

There is a request for robust MEMS devices. Further, there is a request for a method for producing robust MEMS devices.

SUMMARY

Embodiments provide for a MEMS device comprising a first electrode structure and a second electrode structure forming a capacitive sensing arrangement. The MEMS device comprises a plurality of anti-stiction bumps arranged between the first electrode structure and the second electrode structure at a corresponding plurality of locations. The plurality of locations is distributed so as to comprise a first distribution density in a first main surface region of a main surface into which the plurality of locations is projected. The plurality of locations comprises a second, different distribution density in a second main surface region of the main surface, the second main surface region being delimited from the first main surface region. Anti-stiction bumps provide for mechanical stress when the first and the second electrode structure abut to each other such that the anti-stiction bumps contact the other electrode structure, i.e., they form a mechanical contact or hit each other. By arranging the anti-stiction bumps with different distribution densities, the mechanical stress induced into the electrode structures may be adjusted so as to prevent mechanical overloads and may thus provide for robust MEMS devices.

A further embodiment provides a method for producing a MEMS device. The method comprises forming a capacitive sensing arrangement with a first electrode structure and a second electrode structure. The method comprises arranging a plurality of anti-stiction bumps between the first electrode structure and the second electrode structure at a corresponding plurality of locations. The method is executed such that the plurality of locations being projected into a main surface of the second electrode structure is distributed so as to comprise a first distribution density in a first main surface region of the main surface and so as to comprise a second, different distribution density in a second main surface region of the main surface, the second main surface region being delimited from the first main surface region.

Further embodiments are described in the dependent claims.

BRIEF DESCRIPTION OF THE DRAWINGS

Embodiments will be described in the following while making reference to the accompanying drawings in which:

FIG. 14 shows a schematic flowchart of a method according to an embodiment.

DETAILED DESCRIPTION OF ILLUSTRATIVE EMBODIMENTS

Figure 1A:
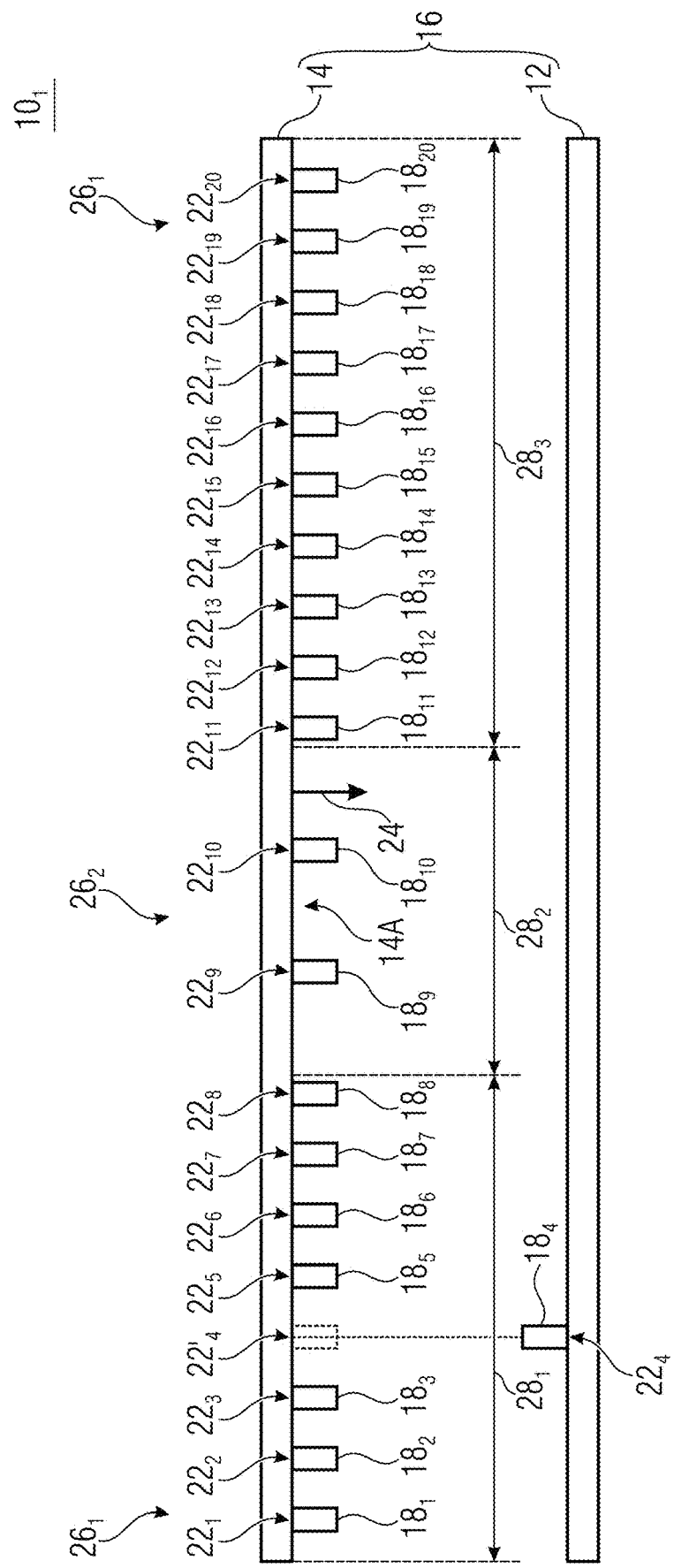
FIG. 1a shows a schematic side view of a MEMS device according to an embodiment in which anti-stiction bumps are arranged with a first and a second non-zero distribution density.

Equal or equivalent elements or elements with equal or equivalent functionality are denoted in the following description by equal or equivalent reference numerals even if occurring in different figures.

In the following description, a plurality of details is set forth to provide a more thorough explanation of the embodiments of the present invention. However, it will be apparent to those skilled in the art that embodiments of the present invention may be practiced without these specific details. In other instances, known structures and devices are shown in block diagram forms rather than in detail in order to avoid obscuring embodiments of the present invention. In addition, features of the different embodiments described in hereinafter may be combined with each other, unless specifically denoted otherwise.

Embodiments described herein relate to microelectromechanical structures (MEMS) having a capacitive sensing arrangement. Such capacitive sensing arrangements may comprise at least one backplate structure that may be referred to as a stator electrode or an electrode that is regarded as being essentially static or immobile. The MEMS further comprises at least one movable electrode structure, e.g., a membrane structure that is configured to be deflectable with regard to the backplate structure. Although both electrode structures may be formed deflectable with respect to each other, precise measurements may be obtained when forming one of the electrode structures as a fixed, static backplate structure. The deflection may lead to a varying distance between the electrode structures and thus to a varying capacitance between the electrodes, the varying capacitance being a parameter to be evaluated within the capacitive sensing arrangement. For example, such capacitive sensing arrangements may be used in microphone structures, in pressure sensor structures or in photoacoustic sensor structures.

MEMS devices may be manufactured in semiconductor-technology and/or may comprise semiconductor materials. Examples for such materials are layers or wafers comprising a silicon material, a gallium-arsenide-material and/or different semiconductor materials. MEMS devices may comprise one or more layer sequences or stacks of layers comprising conductive, semi-conductive and/or insulating layers so as to implement a respective MEMS functionality. In embodiments described hereinafter, one or more backplate electrodes or structures may form a stack together with at least one membrane structure or electrode. The backplate structure and the membrane structure may be held, fixed and/or clamped at respective outer regions with a substrate structure. The substrate structure may comprise, for example, amorphous, polycrystalline or crystalline semi-conductor materials such as silicon.

Although the membrane structures are described hereinafter as comprising a conductive layer only, according to embodiments, one or both sides of the membrane structure is/are covered with an insulating material to increase robustness and/or to prevent short-circuits.

FIG. 1a shows a schematic side view of a MEMS device $10_1$ according to an embodiment. The MEMS device comprises an electrode structure 12 and a further electrode structure 14, wherein at least one of the electrode structures 12 and/or 14 is deflectable with respect to each other. The electrode structures 12 and 14 form a capacitive sensing arrangement 16. That is, a deflection of at least one of the electrode structures 12 and 14 with respect to the other electrode structure 14, 12 respectively, may be detected, sensed or measured due to a varying capacitance between the electrode structures 12 and 14.

Between the electrode structures 12 and 14, a plurality of anti-stiction bumps $18_1$ to $18_{19}$ may be arranged. The anti-stiction bumps may be arranged at the electrode structure 12 and/or at the electrode structure 14. A simple way for manufacturing MEMS devices with anti-stiction bumps is to form same by using recesses in a sacrificial layer, filling the recesses, followed by arranging an electrode structure on top of the sacrificial material. Whilst this does not exclude to form at least a subset of the anti-stiction bumps as stalagmite structures, forming the anti-stiction bumps as stalactite structures allows for simple processes. That is, the anti-stiction bumps $18_1$ to $18_{20}$ may be arranged at a mobile and/or immobile electrode structure.

A number of anti-stiction bumps $18_1$ to $18_{20}$ may at least be influenced from a side of the electrode structures 12 and/or 14. Alternatively or in addition, the number of anti-stiction bumps may be at least influenced by a design of the MEMS device $10_1$, e.g., a distance between the electrode structures 12 and 14 and/or a size of a possible abutting area in which the electrode structures 12 and 14 possibly form a mechanical contact when deflecting the at least one deflectable electrode structure.

Each of the anti-stiction bumps is arranged at a respective location $22_1$ to $22_{20}$, e.g., at the electrode structure 12 or the electrode structure 14. The locations $22_1$ to $22_{20}$ may be projected into a main surface 14A of the electrode structure 14. The main surface 14A may be a surface of the membrane structure 14 facing the electrode structure 12 or facing away from the electrode structure 12 and having an opposing second main surface. Both main surfaces may be connected to each other by a side surface of the membrane structure, e.g., a lateral surface of a round, elliptical or polygon shaped cylinder having the main surfaces as top surface, bottom surface respectively. Locations $22_1$ to $22_4$ may be projected into the main surface 14A, for example, along a surface normal 24 of the main surface 14A or parallel to a surface normal of a stator electrode, a backplate structure respectively. Anti-stiction bumps $18_1$ to $18_3$ and $18_5$ to $18_{20}$ may define such projected locations by their real locations $22_1$ to $22_3$ and $22_5$ to $22_{20}$. An anti-stiction bump being arranged at a different electrode structure such as the anti-stiction bump $18_4$ may be projected such that a projected location $22'_4$ is considered when determining distribution densities $26_1$ and $26_2$ of the anti-stiction bumps $18_1$ to $18_{20}$, their associated locations $22_1$ to $22_{20}$, including the projected locations respectively.

The locations 22 and 22' may comprise different distribution densities $26_1$ and $26_2$ in different, delimited surface regions $28_1$, $28_2$ and $28_3$. For example, the surface region $28_2$ may be sandwiched between the surface regions $28_1$ and $28_3$. Although a number of anti-stiction bumps arranged in the respective surface region $28_1$ and $28_3$ may be different and although the density of the anti-stiction bumps 18 in those regions may differ from each other, the density including the projections 22' of the locations 22 may be equal in the surface regions $28_1$ and $28_3$. Alternatively, the distribution density $28_3$ may differ from the distribution density $28_1$. In contrast, the distribution density $28_6$ differs from the distribution density $26_1$. That is, between the delimited main surface $28_1$ and $28_2$, a different density of anti-stiction bumps, including the projection thereof, is arranged, i.e., in a specific reference area, e.g., one square micrometer, two square micrometers, four square micrometers or the like, a different number of anti-stiction bumps, including the projection thereof, is arranged.

The distribution density $26_2$ may be smaller than the distribution density $26_1$. For example, the main surface region $28_2$ may be arranged in a center portion of the backplate structures 12 and/or 14. The main surface region $28_2$ may be arranged in a center portion of the electrode structure 12 and/or 14. That is, the area covered by the main surface region $28_2$ at the respective electrode structure and/or when being projected into the main surface 14A overlaps with a geometric center of the respective electrode structure. Possibly but not necessarily, a center of the main surface region $28_2$ corresponds to the geometric center of the electrode structure within a tolerance range of 15%, 10% or 5%. According to an example, the lower-valued or zero-valued bump density (distribution density) is located in the center of a membrane structure. This allows to consider that a deflection of a membrane structure may be high or even maximum in a center thereof, therefore having a comparatively high probability for abutment and thus a possibly high stress concentration at the bumps in this area.

The main surface region may have a lateral extension along one or more directions, e.g., as a polygon or circle of any suitable value, for example, of at least 50 µm and at most 1.000 µm, at least 70 µm and at most 700 µm or at least 100 µm and at most 500 µm and/or may cover an area of at least 5% and at most 80% or at least 10% and at most 70% or at least 15% and at most 50% of the respective electrode structure.

Alternatively to a center position, the main surface region $28_2$ may be arranged at a different location with same or different size. For example, a location of the main surface region $28_2$ may at least partially be influenced from a location from which a force or pressure is expected to arrive at the deflectable electrode structure 12 or 14. Such a direction may be adjacent to a side of the electrode structure 12 so as to deflect the electrode structure 12 towards the electrode structure 14 or the electrode structure 14 towards the electrode structure 12, e.g., in case of an under-pressure. Alternatively, the force may arise from a side of the electrode structure 14 so as to deflect the electrode structure 14 towards the electrode structure 12 or so as to deflect the electrode structure 12 towards the electrode structure 14, e.g., in case of the under-pressure.

The electrode structure 14 may have any suitable cross-section, for example, with a round shape, a rounded rectangle shape, a polygon shape or the like. A diameter or a largest dimension between any two arbitrary points at a same main surface may be, for example, between at least 50 µm and at most 5000 µm, between at least 80 µm and at most 5000 or between at least 100 µm and at most 2000 µm. A thickness of the silicon layer providing for the conductive layer of the electrode structure 12 and/or 14 may be at least 50 nm and at most 5000 nm, at least 80 nm and at most 3000 nm or at least 100 nm and at most 2000 nm. The silicon material may provide for an elastic and electrically conductive property, e.g., when using mono or poly-silicon. The backplate structure may be implemented similarly. Nitride layers arranged between the electrode structures so as to prevent short-circuits and/or to provide for a high stiffness may be arranged. That is, one layer may ensure a high stiffness and also electrical insolation in case the membrane touches the backplate. A further layer may be used as an electrode.

The anti-stiction bumps may have a dimension along the surface normal 24 or parallel hereto between 50 nm and 3000 nm, 8o nm and 2500 nm or between 100 nm and 2000 nm. A radius of curvature at an end facing the respective other electrode structure may vary within a range of at least 5 nm to 2000 nm, 7 nm to 1500 nm or 10 nm to 1000 nm.

Figure 1B:
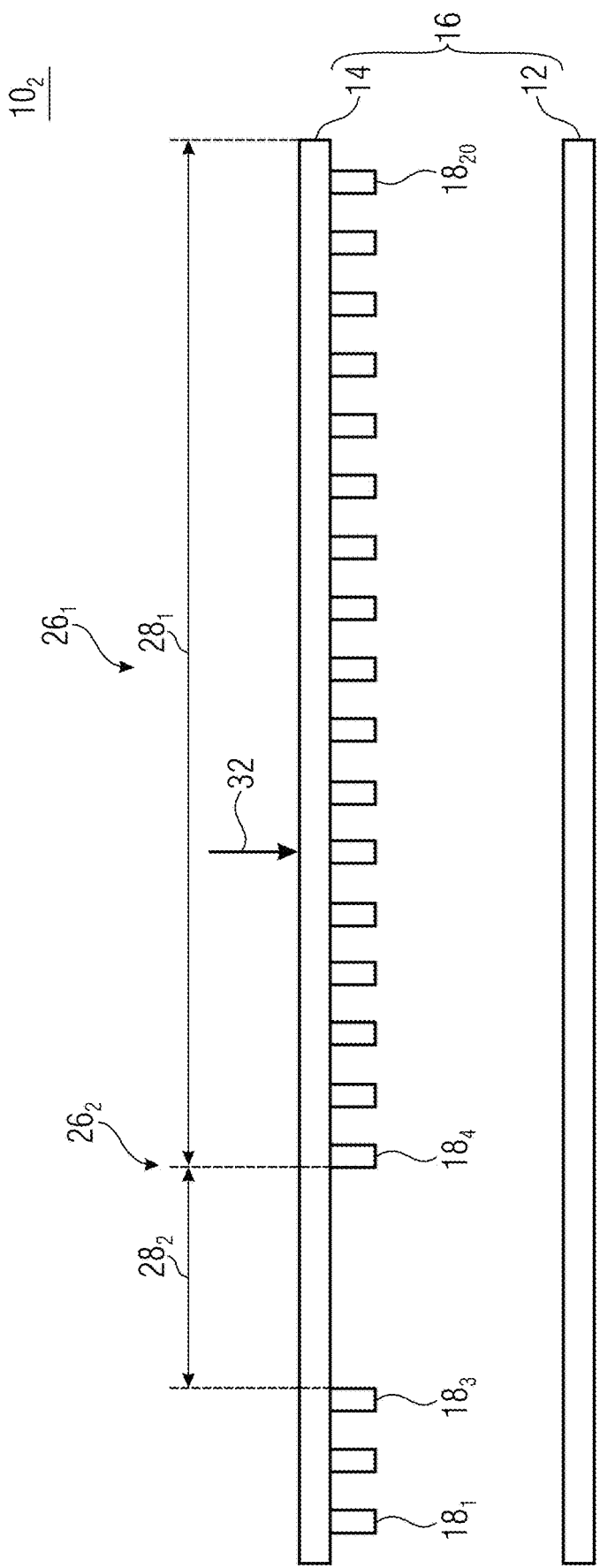
FIG. 1b shows a schematic side view of a MEMS according to an embodiment, wherein the second distribution density is zero.

FIG. 1b shows a schematic side view of a MEMS $10_2$ according to an embodiment. When compared to the MEMS device $10_1$, the main surface region $28_2$ is out of a center 32 of the electrode structure 14. Alternatively or in addition, the distribution density $26_2$ may be zero, i.e., in the main surface region $28_2$ there is in this example neither arranged an anti-stiction bump nor a projection thereof.

The MEMS device $10_1$ and the MEMS device $10_2$ provide for a decreased amount of mechanical stress that is induced into the electrode structures 12 and 14 in the main surface region $28_2$ when the electrode structures 12 and 14 abut each other such that mechanical contact is formed between the anti-stiction bumps 18 and both electrode structures 12 and 14, when compared to the surface region $28_1$. By having a low mechanical stress, a high robustness may be obtained.

The high robustness may in particular be obtained in a case where strong forces lead to the contact between the electrode structures 12 and 14. Such strong forces may, for example, occur in case the electrode structures 12 and 14 abut each other thereby pressing one or more anti-stiction bumps $18_i$ against the opposing electrode structure. This pressing may lead to strong forces in the abutting and/or abutted electrode structure at the location of the anti-stiction bump $18_i$. A source for such abutment may be, for example, a high pressure acting on the MEMS. The strong forces may encountered by use of a lower, possibly zero density, i.e., a lower number of anti-stiction bumps $18_i$ per area in the region that is exposed or susceptible to abutment, e.g., in a center area or the main surface region $28_2$. This allows to have a maximum of deflection in the center or main surface region 14A and/or a high stress concentration in the main surface region 14A.

In case of occurrence of a fast burst of pressure or pressure due to air flow, the pressure increase on the membrane may be at first concentrated in an area that corresponds to the projection of the port location which may be the center of the electrode structures. I.e., the main surface region 14A may be in a center area and/or may be arranged corresponding to a location of a port as will be described in connection with FIG. 3. That is, in case of a pressure burst or pressure, e.g., from air flow, the pressure is at first exerted on the membrane in an area corresponding to the port projection which may be considered when arranging the main surface region $28_2$ correspondingly, at least within tolerance ranges.

To explanation of anti-stiction bumps: to avoid that the membrane sticks too strong with the backplate due to electrostatic forces when they enter in contact, anti-stiction bumps are made in order to maintain a certain distance between the two electrodes and to reduce contact forces per area.

Figure 2B:
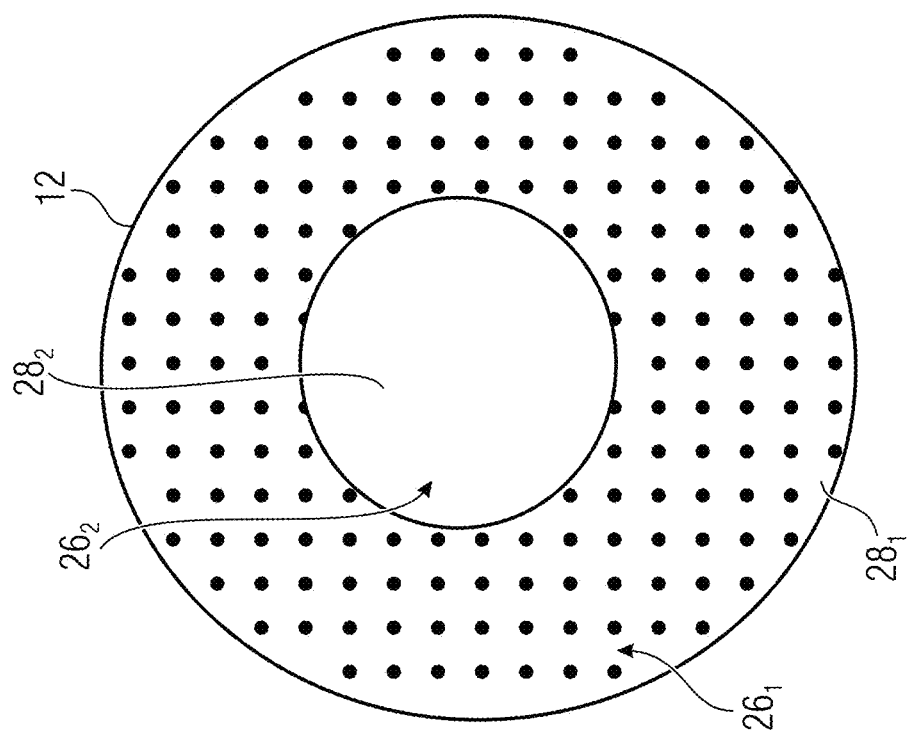
FIG. 2b shows a schematic top view of the electrode structure according to an embodiment, wherein the one of the distribution densities of FIG. 2a is zero.
Figure 2A:
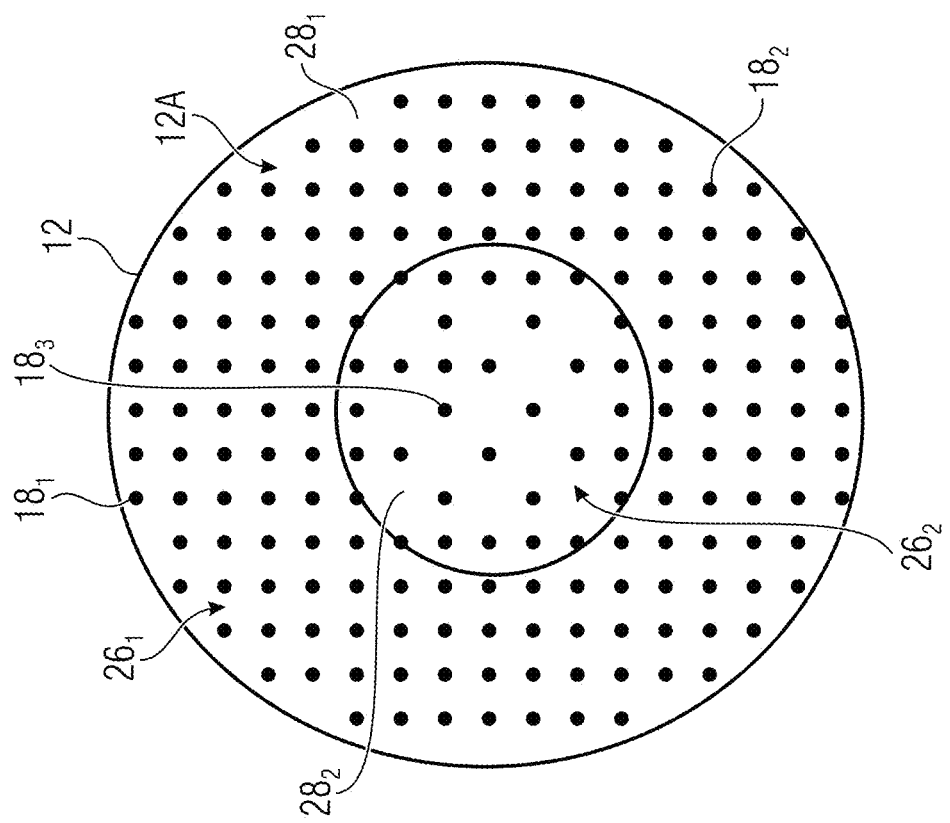
FIG. 2a shows a schematic top view of an electrode structure according to an embodiment comprising a plurality of anti-stiction bumps at a main side of the electrode structure with different non-zero distribution densities.

FIG. 2a shows a schematic top view of an electrode structure 12 according to an embodiment comprising a plurality of anti-stiction bumps 18 at a main side 12A of the electrode structure 12. As the locations of the anti-stiction bumps 18 may be projected into the main surface 14A of the second or further electrode structure, explanations given in connection with the main surface regions $28_1$, $28_2$, respectively, the distribution density $26_1$, $26_2$, respectively may be transferred, without any limitations to the anti-stiction bumps arranged at the electrode structure 12. For example, the main surface region $28_2$ may be arranged in a center region of the electrode structure 12. In the respective center region, a lower distribution density $26_2$ may be implemented when compared to the distribution density $26_1$ of the main surface region $28_1$ surrounding the main surface region $28_2$. Although the anti-stiction bumps 18 may be arranged in a regular manner or pattern in the main surface regions $28_1$ and/or $28_2$, the anti-stiction bumps may alternatively be arranged in an irregular or random way.

FIG. 2b shows a schematic top view of the electrode structure 12 according to an embodiment, wherein the distribution density $26_2$ is zero, i.e., in the main surface region $28_2$, the number of anti-stiction bumps is zero.

In particular in connection with the distribution density $26_2$ being zero, the respective electrode structure 12 and/or 14 may at least partially be removed or absent, i.e., may comprise an opening which will be described in connection with further embodiments.

Figure 3:
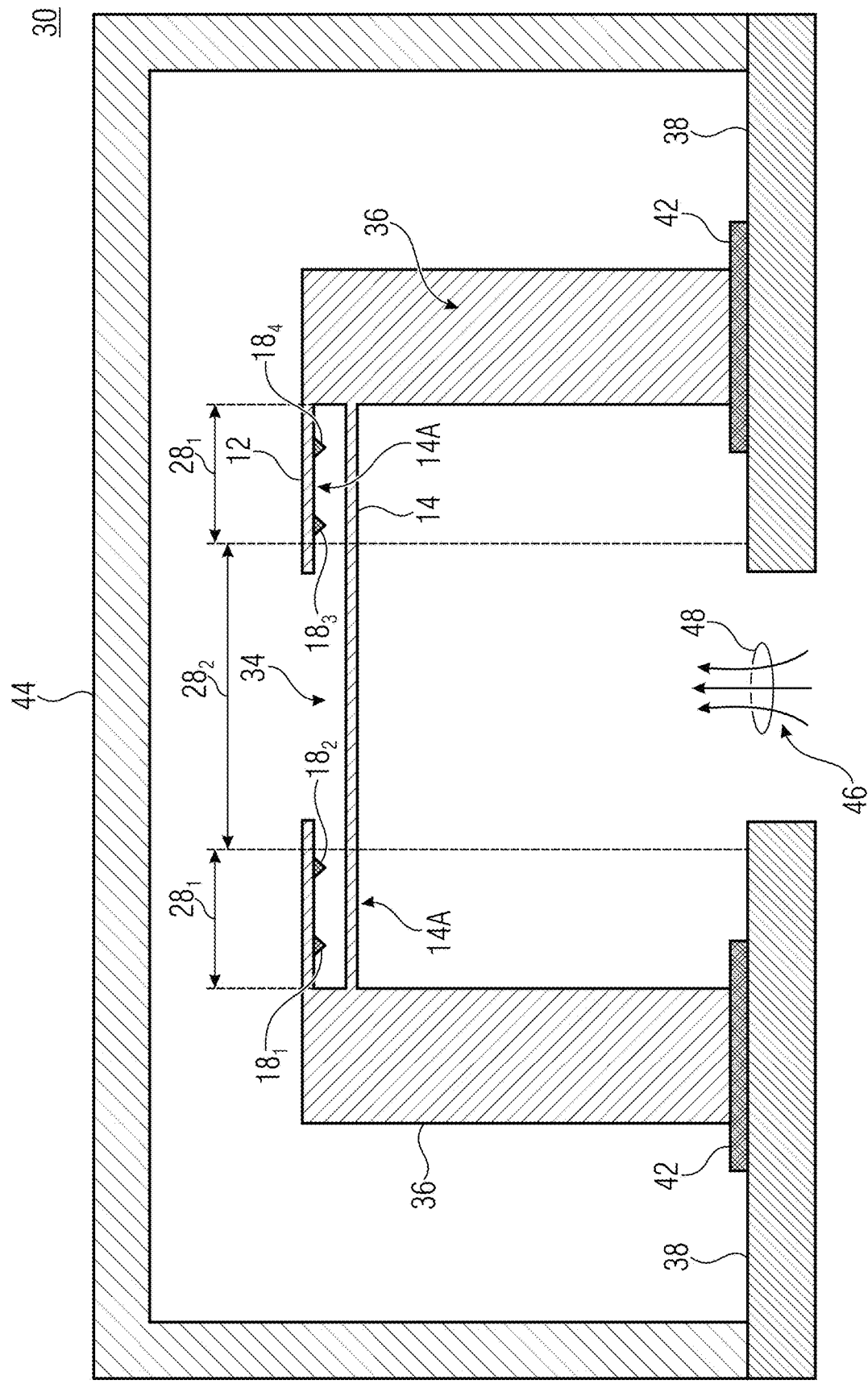
FIG. 3 shows a schematic side view of a MEMS according to an embodiment, wherein the electrode structure, being a backplate structure, comprises an opening.

FIG. 3 shows a schematic side view of a MEMS 30 according to an embodiment, wherein the anti-stiction bumps $18_1$ to $18_4$ are arranged at the electrode structure 12, wherein the electrode structure 12, being a backplate structure for example, comprises an opening 34 that forms at least a part of the main surface region $28_2$. According to an embodiment, the opening 34 completely forms the main surface region $28_2$.

According to an embodiment, the main surface region $28_2$ is in encircled by the main surface region $28_1$, e.g., the opening 34 is encircled by the main surface region $28_1$ as described, for example, in connection with FIG. 2b.

The electrode structures 12 and 14 may be clamped, fixed or held by a substrate structure 36. The arrangement comprising the substrate structure 36 and the electrode structures 12 and 14 may be arranged, fixed or connected to a bases 38, e.g., comprising circuit structures or the like that are adapted to electrically contact the electrode structures 12 and/or 14, e.g., by use of the substrate structure 36 having conductive traces. Such a connection between the bases 38 and the substrate structure 36 may be provided by use of a mechanical connection 42, e.g., a solder material or a glue material. The bases 38 may at least partially be formed by conductive structures such as a printed circuit board (PCB). The substrate structure 36 and the electrode structures 12 and 14 may at least partially be covered by a housing lid 44. The housing lid 44 and the bases 38 may together form a housing of the MEMS device 30. An opening 46 of the housing may be arranged in the basis or in the housing lid so as to implement a bottom port configuration, a top port configuration respectively. That is, the opening 46 may be referred to as a port of the package. The opening 46 may be arranged such that a location of the opening 46 projected into the main surface 14A or the opposing side overlaps at least partially with the second main surface region.

A source 48 of forces leading to a deflection of at least one of the electrode structures, traveling through the opening 46 may lead to an abutment of the electrode structures 12 and 14. For example, the source 48 may be a pressure that is part of an air flow travelling through the opening 46. By arranging the opening 46 so as to at least partially overlap with the second main surface region $28_2$, to arrange the second main surface region $28_2$ so as to at least partially overlap with the opening 46 respectively leads to a more mechanically robust MEMS device, especially in case of a mechanical contact between the electrode structure being pressed against an opposing electrode structure or abutting same. That is, the second main surface region $28_2$ provides for a robust area of the capacitive sensing arrangement. In an area of abutment caused by source 48, the mechanical load acting on the electrode structure being hit by or abutted by an anti-stiction bump may be reduced when compared to the main surface area $28_1$ in accordance with the reduction of the number or density of anti-stiction bumps 18.

According to an embodiment, a location of the second main surface region $28_2$ and the location of the opening 46 of the housing correspond to each other within a tolerance range of ±20%, ±15%, ±10%. Alternatively or in addition, a size of the second main surface region $28_2$ and a size of the opening 46 of the housing correspond to each other within a tolerance range of ±20%, ±15% or ±10%. According to an embodiment, one or both of the locations and/or the sizes correspond to each other within a tolerance range of ±5% or even exactly, i.e., within tolerance ranges of manufacturing. That is, the location of the opening 46 of the housing of the MEMS device 30 projected into the main surface 14A or 12A may form at least a part of the second main surface region $28_2$.

For example, the opening or port 46 may have a diameter of at least 50 μm to at most 2000 μm, or at least 70 μm to at most 1500 μm or of at least 100 μm to at most 1000 μm. Alternatively or in addition, the dimension of the port 46 may be in range of at least 1 and at most 10, of at least 1.5 and at most 7 or of at least 2 to at most 5 times smaller than the membrane. The main surface region $28_2$ may be of a same size as the port but may also be smaller, e.g., slightly smaller or larger, e.g., slightly larger. A slight deviation may be understood as a variation of at most 50%, at most 25% or at most 10%.

Figure 4:
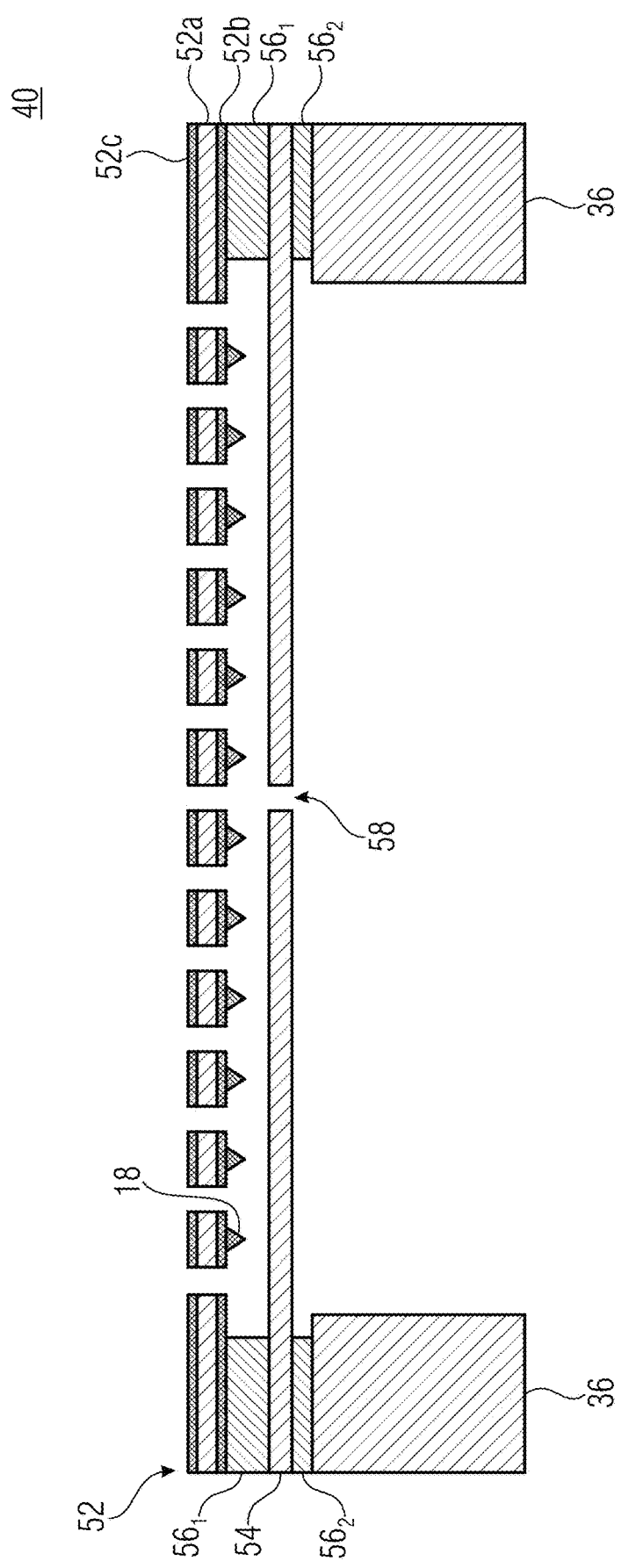
FIG. 4 shows as schematic side view of a known MEMS comprising a substrate structure that carries a backplate structure and a membrane structure.

FIG. 4 shows as schematic side view of a known MEMS device 40 to provide a basis for a subsequent description of further embodiments. The MEMS device 40 may comprise the substrate structure 36 that carries a backplate structure 52 and a membrane structure 54. The backplate structure 52 may comprise a conductive layer 52a that may provide for the functionality of an electrode. The conductive layer may comprise a doped semiconductor material, e.g., crystalline or polycrystalline silicon, and/or a metal material. The conductive layer 52a may be separated from the membrane structure 54 by an insulating layer 52b, e.g., comprising a silicon oxide material or a silicon nitride material.

The membrane structure 54 may also comprise a conductive material such as a doped polysilicon material. The membrane structure 54 may comprise a ventilation hole 58 allowing for a ventilation and/or pressure exchange between both sides of the membrane.

To further increase mechanical robustness, a further insulating layer 52c may be arranged such that the conductive layer 52a is sandwiched between the insulating layers 52b and 52c. By way of example, anti-stiction bumps 18 may be formed from the insulting layer 52b. The electrode structures 52 and 54 may be separated from each other and from the substrate structure 36 by use of an insulating material 56 such as silicon nitride or silicon oxide.

Figure 5:
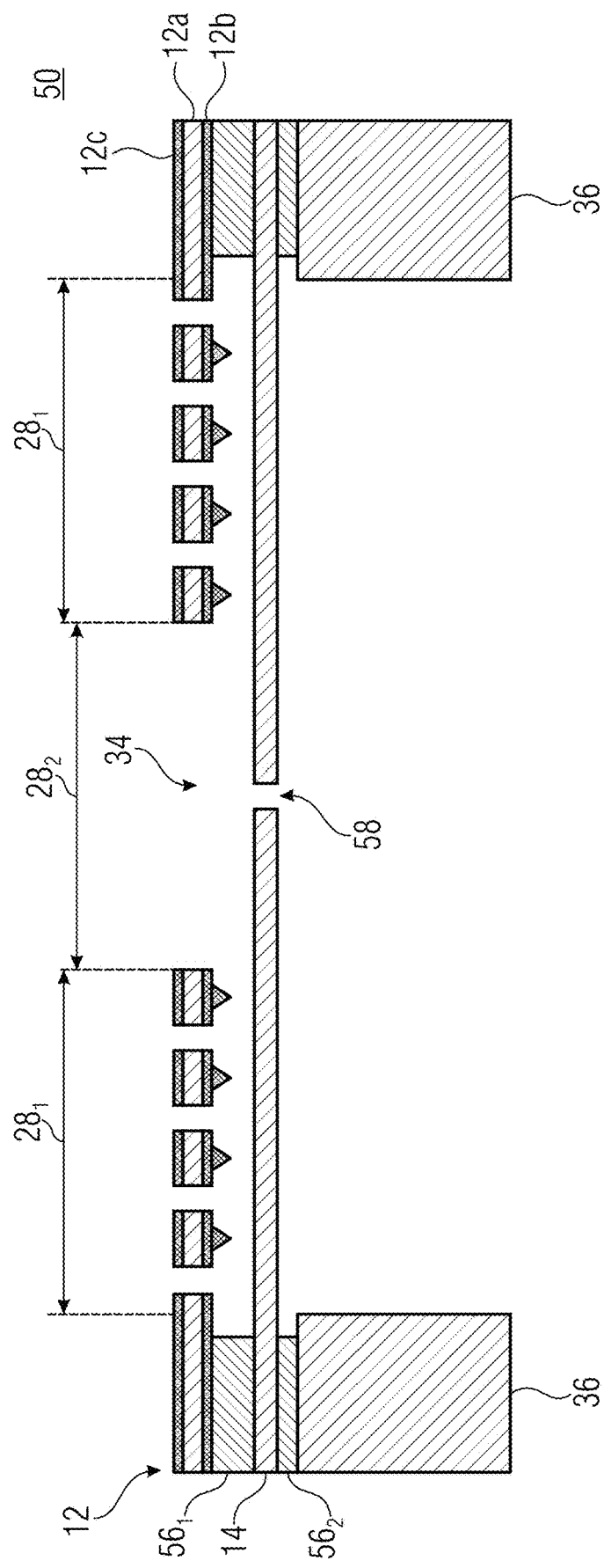
FIG. 5 shows a schematic side view of a MEMS device according to an embodiment and in view of the MEMS device of FIG. 4.

FIG. 5 shows a schematic side view of a MEMS device 50 according to an embodiment. When compared to the MEMS 40, the electrode structure 12 which may be a layered structure with layers 12a, 12b and 12c that may correspond to the layers 52a, 52b and 52c of the structure 52 may comprise the opening 34 so as to implement the main surface region $28_2$. The opening 34 may have a size of at least 100 μm, 150 μm or 200 μm. The size may be understood as an in-plane dimension parallel to a position of the main surfaces of the electrode structures 12 and 14. For example, the opening 34 may comprise a length of an edge or a diameter with such dimensions.

Figure 6:
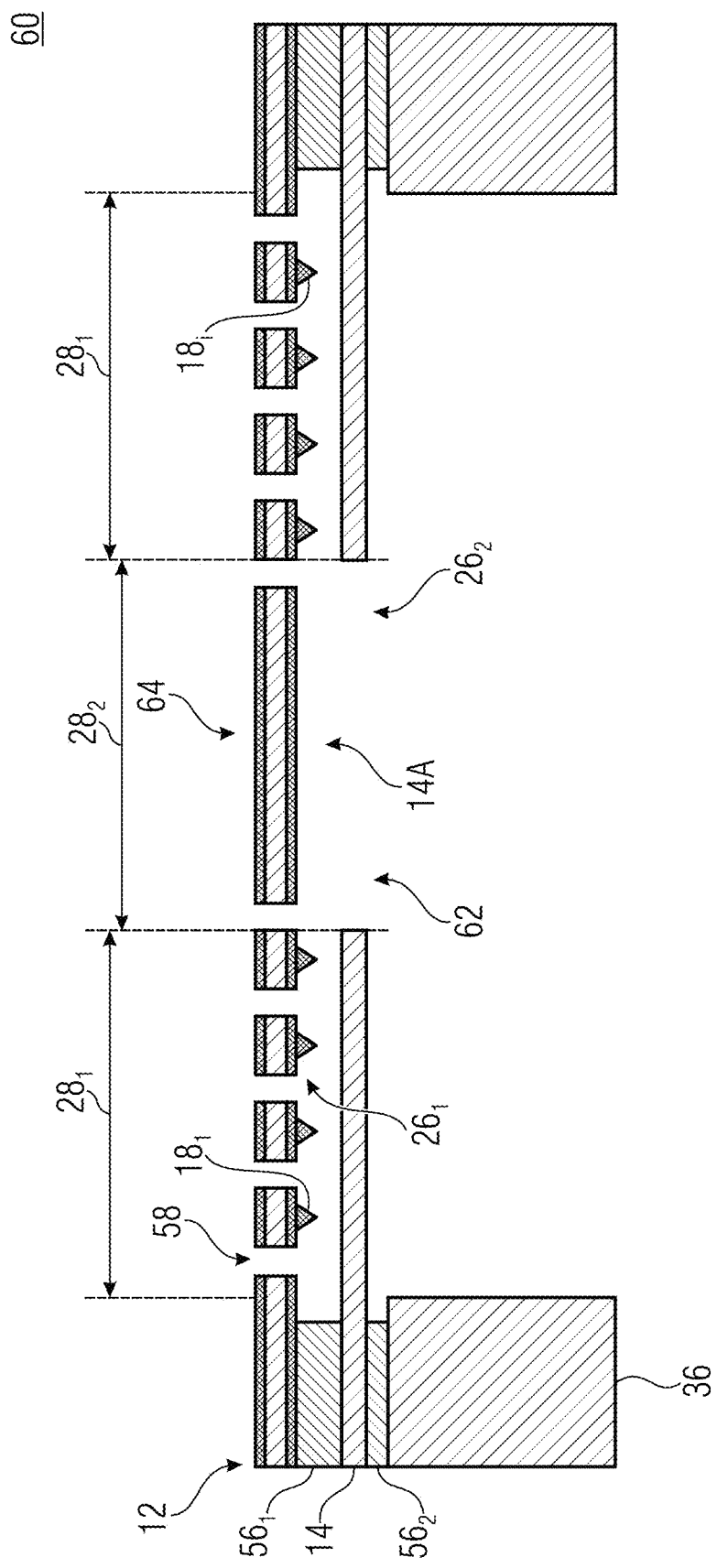
FIG. 6 shows a schematic side view of a MEMS device according to an embodiment; having an electrode structure comprising an opening having a size or diameter of at least 100 µm.

FIG. 6 shows a schematic side view of a MEMS device 6o according to an embodiment. The electrode structure 14 may comprise an opening 62 having a size or diameter of at least 100 μm, at least 150 μm or at least 200 μm and is thus clearly larger when compared to ventilation holes 58 having a diameter of at most 10 μm, 20 μm or 30 μm.

One or more of the ventilation holes 58 contained in the electrode structure 12 may be arranged aside or beside the main surface area $28_2$. According to an embodiment, a portion 64 of the electrode structure 12 that faces or overlaps with the opening 62 is implemented so as to comprise a lower number or even no ventilation holes 58. Such missing perforation allows to limit an acoustic vent to the other side of the electrode structure 12, e.g., the back volume whilst allowing for pressure exchange through the ventilation hole 58.

The electrode structure 12 may be formed so as to comprise the anti-stiction bumps in the region corresponding to the main surface region $28_1$ whilst being implemented so as to have a distribution density $28_6$ of zero in the area corresponding to the main surface region $28_2$. This may be referred to as the portion 64 of the electrode structure 12 being formed without anti-stiction bumps or with a lower amount thereof.

In the main surface region $28_2$, there is no overlap between electrode structures 12 and 14 such that capacitive measurement is independent or at least almost independent from a movement of the electrode structures in this area.

Figure 7:
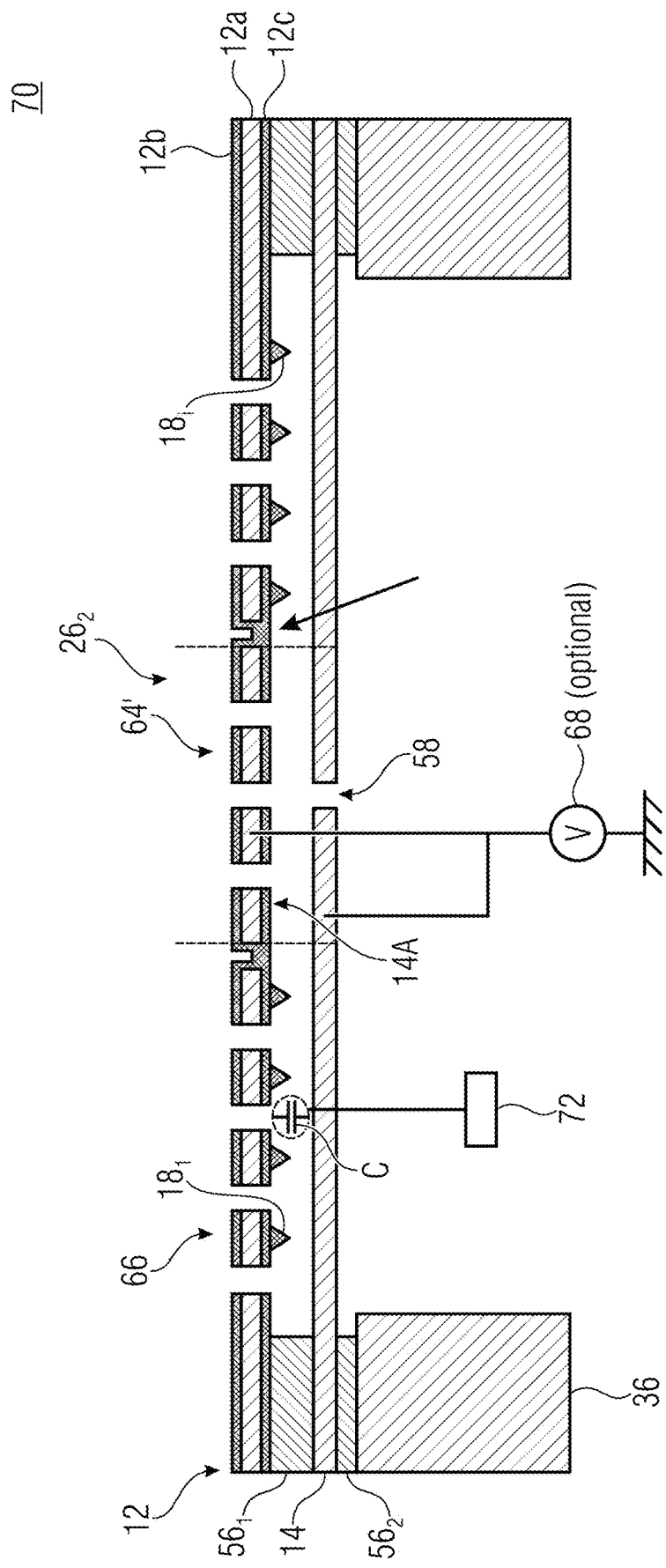
FIG. 7 shows a schematic side view of a MEMS device according to an embodiment in which a central portion of a backplate electrode is insulated from a remaining portion.

FIG. 7 shows a schematic side view of a MEMS device 70 according to an embodiment. The anti-stiction bumps $18_1$ to $18i$ with "i" being any suitable number of larger than 1, e.g., 5 or more, 10 or more, 20 or more, 100 or more, or even a higher number, are arranged at the electrode structure 12. The electrode structure 14 may be implemented as described for the electrode structure 54 of MEMS 40. As described in connection with the MEMS device 60, a portion 64' of the electrode structure 12 may be formed so as the distribution density $26_2$. When compared to the MEMS device 60, the portion 64' may be electrically insulated from a remaining portion 66 of the electrode structure 12. For example, the conductive layer 12a may be broken, cut, segmented or interrupted completely between the portion 64' and the remaining portion 66. The portion 64' may be fixed or connected mechanically to the remaining portion 66 by use of a material used for the insulating layers 12b and/or 12C in a same, lower or higher layer thickness. For example, a segmentation of the portion 64' with respect to the remaining portion 66 may be implemented as described in US 2015/0289046 or US 2013/0221453. The remaining portion 66 may provide for a backplate area that is electrically insulated from the portion 64' forming a further backplate area. The portion 64' may form at least a part of the main surface region $28_2$.

Optionally, the conductive layer 12a of the portion or segment 64' may be electrically connected or may be subjected to a same potential as the electrode structure 14, the conductive layer thereof respectively by connecting both elements to a same optional power supply 68. Thereby, a capacitive effect between the layer 12a in the portion 64' and the electrode structure 14 is reduced or even eliminated such that a similar effect when compared to the MEMS device 60 may be obtained without providing for the opening 62. A capacitance C between the layer 12a in the remaining portion 66 and the conductive layer of the electrode structure 14 may be evaluated, for example, using a readout circuit 72.

Figure 8:
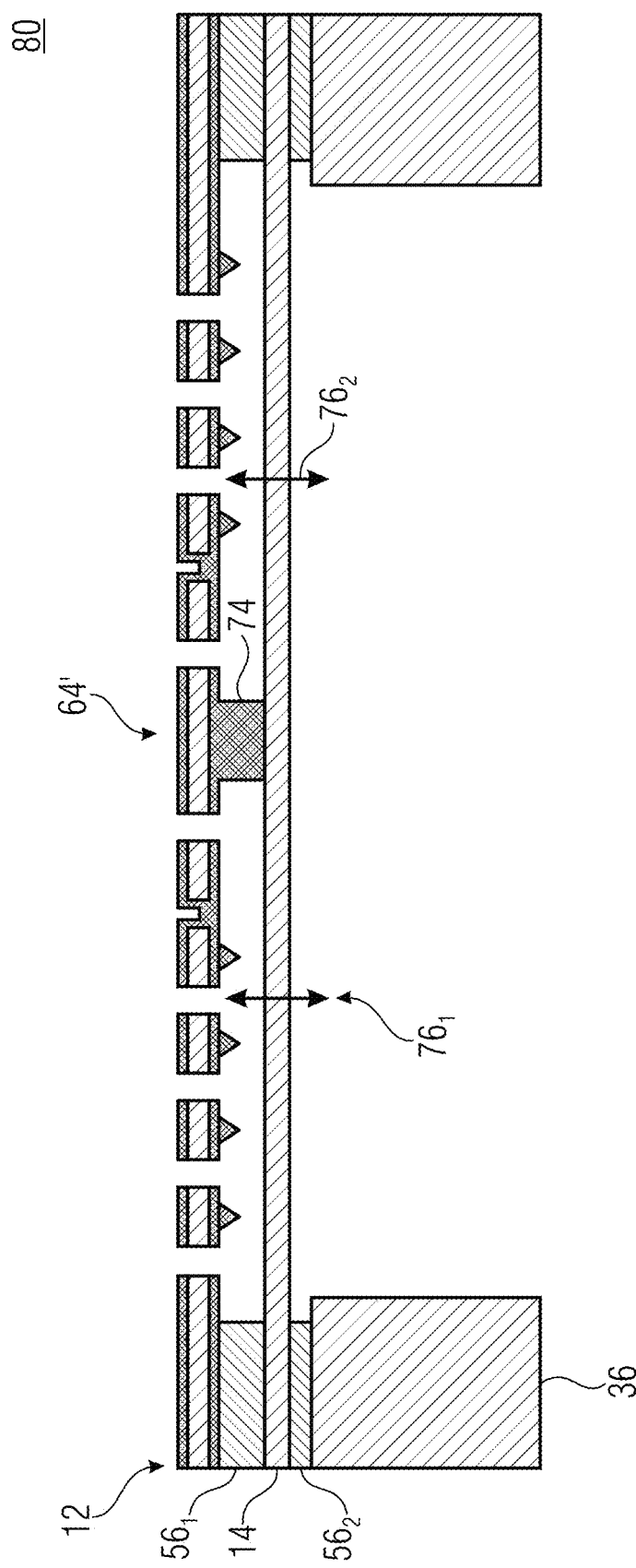
FIG. 8 shows a schematic side view of a MEMS device according to an embodiment in which an anchor element is arranged at the central portion.

FIG. 8 shows a schematic side view of a MEMS device 80 according to an embodiment. When compared to the MEMS device 70, an anchor structure 74 may be arranged between the electrode structures 12 and 14 providing for a permanent fixation or mechanical contact between the electrode structure 12 and the anchor structure 74 and between the anchor structure 74 and the electrode structure 14. The anchor structure 14 may be of any suitable material, in particular, a conductive or insulating material. A simple manufacturing may be obtained by implementing the anchor structure 74 as part of a layer of the insulating material $56_1$. For example, the anchoring structure 74 may be a remaining portion of a deposited layer. The anchor structure 74 allows to shift regions $76_1$ and $76_2$ of maximum displacement of the electrode structure 14 from a center of the electrode structure 14 closer to the substrate structure 36.

As described in connection with the MEMS device 70, the portion 64' and the electrode structure 14 may be connected to a same potential or voltage. This allows suppressing anti-stiction bumps without risk of electrostatic stiction. Anchoring of the membrane in the center allows a maximum displacement being shifted to the side of the electrode structure 14, e.g., the membrane structure.

Figure 9:
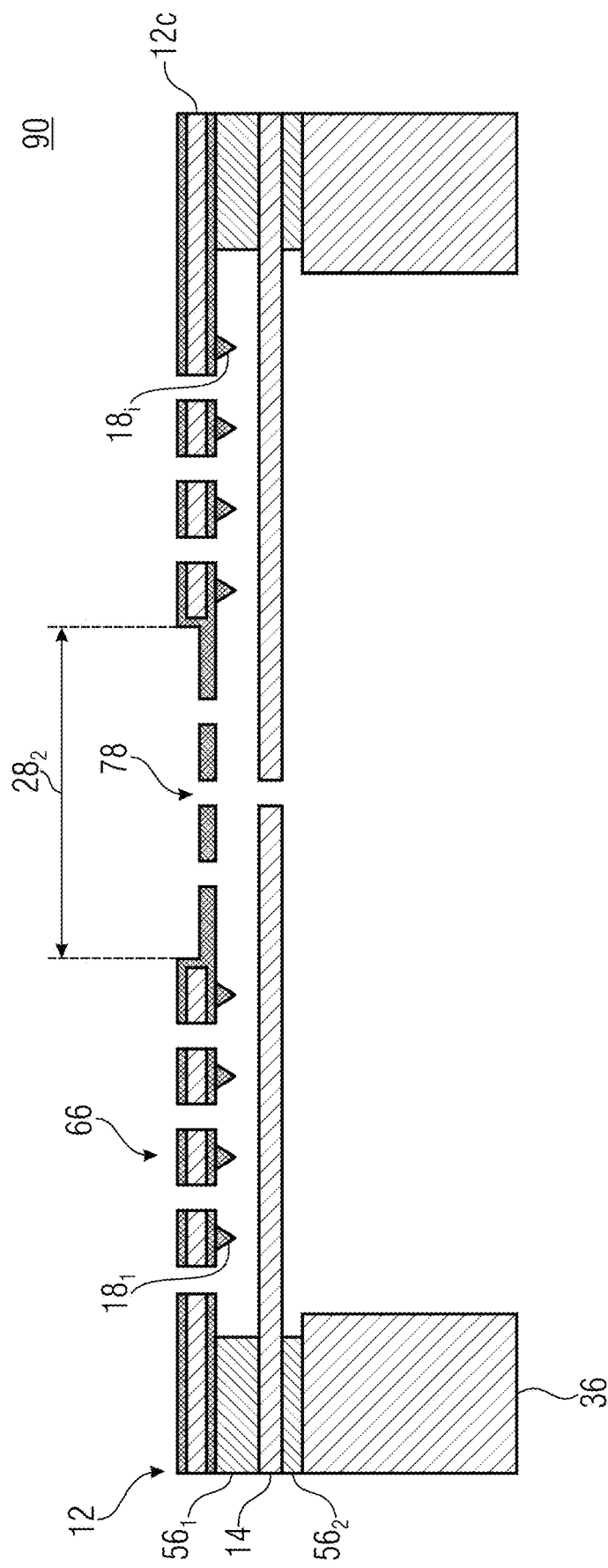
FIG. 9 shows a schematic side view of a MEMS device according to an embodiment; in which the central portion is made of insulating materials only.

FIG. 9 shows a schematic side view of a MEMS device 90 according to an embodiment. The anti-stiction bumps $18_1$ to $18_i$ are arranged at least partially at the electrode structure 12 so as to face the electrode structure 14. The electrode structure 12 may be, for example, a backplate structure. The electrode structure 12 may comprise the remaining portions 66 as described, for example, in connection with the MEMS device 70. When compared to the MEMS device 70 or the MEMS device 80, the electrode structure 12 may comprise an insulating material portion 78, e.g., comprising insulating materials only. That is, when compared to the portion 64 or 64', the conductive layer 12a may be absent. The remaining portion 66 may provide for a backplate area being electrically conductive. The insulating portion 78 may provide for a backplate area being electrically non-conductive, insulating respectively. The backplate area or insulating portion 78 may at least partially form the main surface region $28_2$. That is, an area adjacent to the insulating portion 78 of the remaining portion 66 may optionally be formed as a part of the surface region $28_2$. Arranging only the insulating material, e.g., nitride, may allow to ensure mechanical stability of the electrode structure 12 whilst avoiding electrostatic forces caused by conductive materials such that an arrangement of anti-stiction bumps may be omitted.

Figure 10:
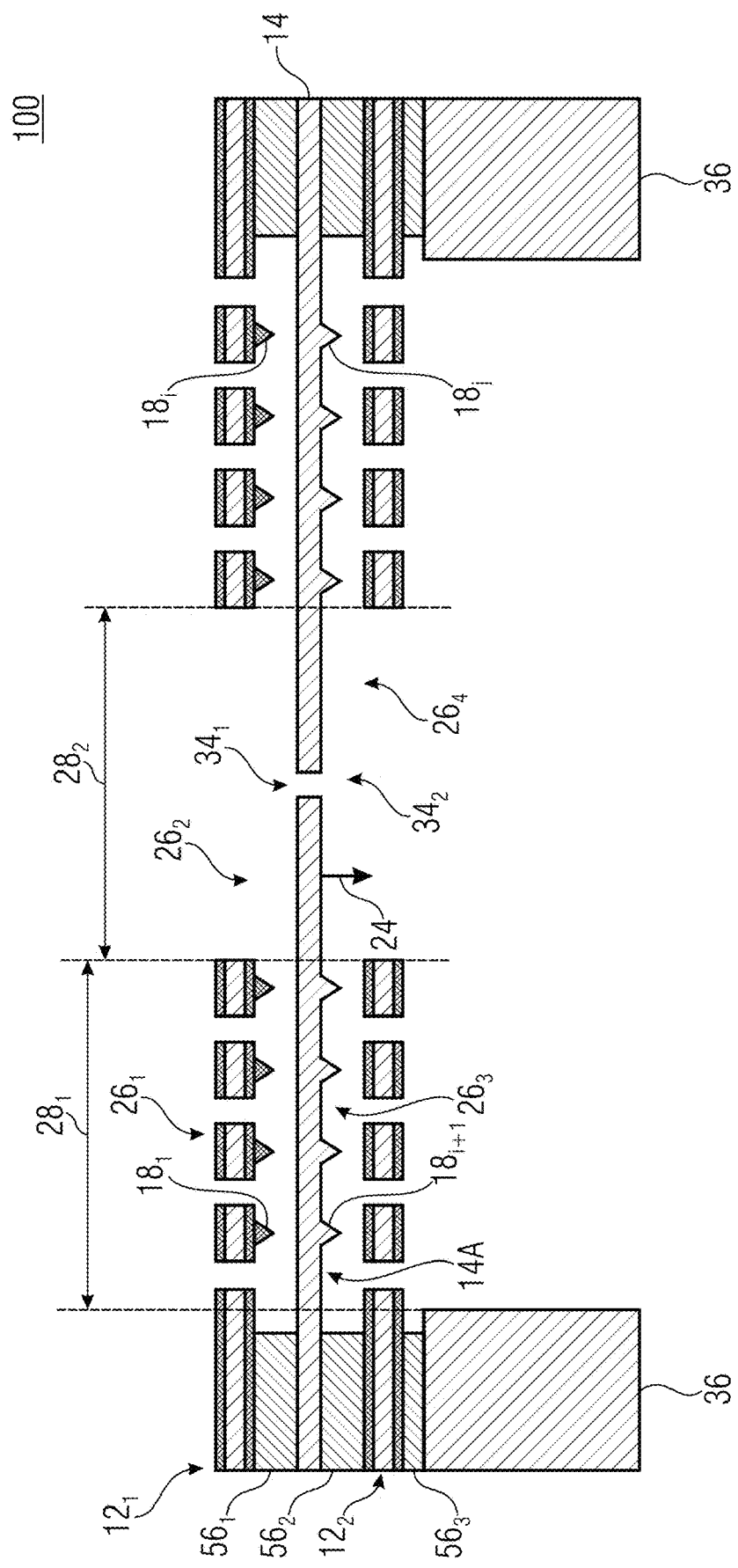
FIG. 10 shows a schematic side view of a MEMS device according to an embodiment that is implemented as dual backplate configuration, both backplates having an opening at the center.

FIG. 10 shows a schematic side view of a MEMS device 100 according to an embodiment. The MEMS device 100 may comprise two backplate structures $12_1$ and $12_2$ sandwiching the electrode structure 14 being formed as a membrane structure. The electrode structures $12_1$ and $12_2$ may each comprise an opening 34 of same or different sizes. For example, the openings $34_1$ and $34_2$ may be arranged at locations corresponding to the main surface area $28_2$. This allows for a high robustness of the electrode structure 14 with respect to mechanical context to both of the electrode structures $12_1$ and $12_2$.

Between the electrode structure $12_1$ and the electrode structure 14, there may be arranged a plurality of anti-stiction bumps $18_1$ to $18_i$. between the electrode structure 14 and the electrode structure $12_2$ there may be arranged a further plurality of anti-stiction bumps $18_{i+1}$ to $18_j$, wherein the pluralities may be of a same number of a different number. As described in connection with the MEMS devices $10_1$ and $10_2$, each of the anti-stiction bumps $18_1$ to $18_j$ is arranged at a respective location. Both, the first plurality of $18_1$ to $18_i$ and the second plurality $18_{i+1}$ to $18_j$ may comprise a respective distribution density $26_2$ or $26_4$ in the main surface region $28_2$, $26_1$ and $26_3$ respectively aside thereof, e.g., in the main surface region $28_1$. The distribution densities $26_2$ of the first plurality $18_1$ to $18_j$ in the main surface region $28_2$ and the distribution density $26_4$ of the second plurality $18_{i+1}$ to $18_j$ in the main surface region $28_2$ of the locations of anti-stiction bumps, the projections thereof respectively, may be same or different. For example, the distribution densities $26_2$ and $26_4$ are equal within a tolerance range of ±10%, ±5%, ±2% or less. FIG. 10 shows a configuration in which both distribution densities $26_2$ and $26_4$ are equal, in particular, they may be zero in absence of the electrode structure $12_1$ and $12_2$ in a region of the main surface region $28_2$ along a direction of the surface normal 24 or opposing hereto.

In other words, MEMS device 100 implements a version with a double backplate structure having no backplate in the center.

Figure 11:
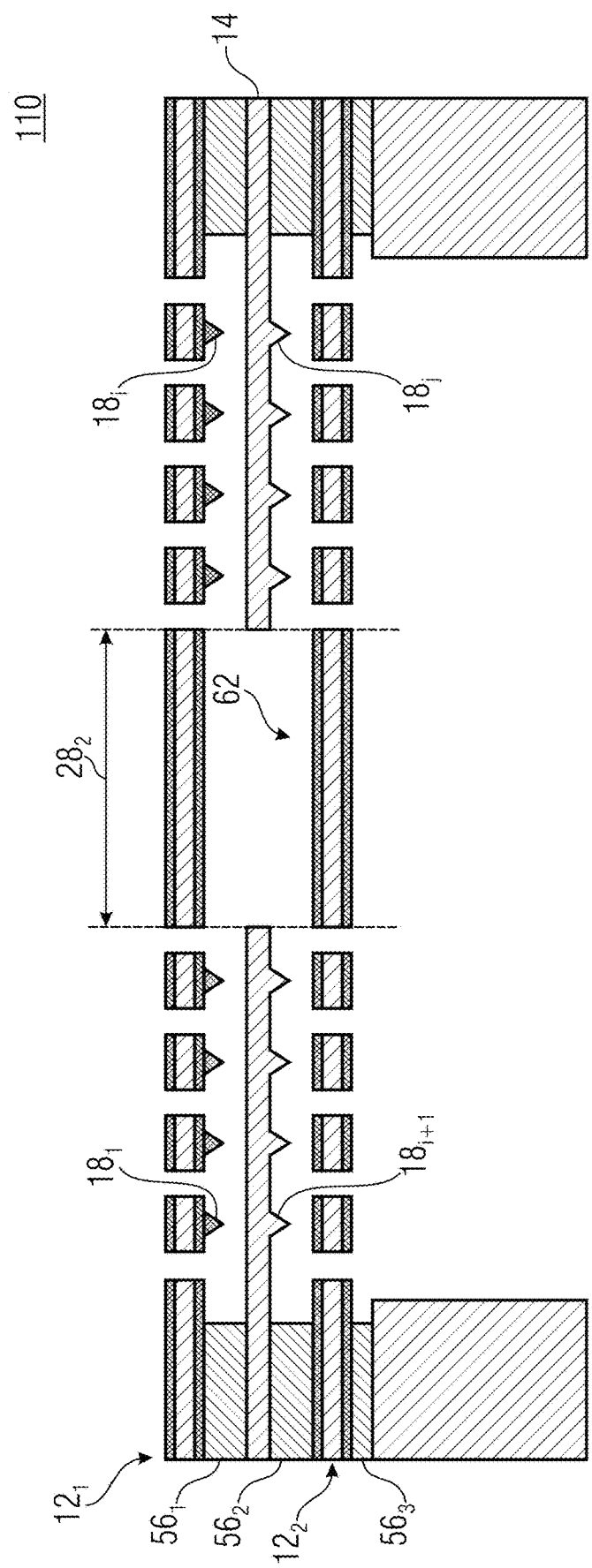
FIG. 11 shows a schematic side view of a MEMS device according to an embodiment that is implemented as dual backplate configuration, the membrane having an opening at the center.

FIG. 11 shows a schematic side view of a MEMS device 110 according to an embodiment that may be referred to as a version with a double backplate having no membrane in the center. For example, the electrode structures $12_1$ and $12_4$ may each be implemented similar to the electrode structure 12 described in connection with the MEMS device 60, alternatively 70 or 90 with exception of the anti-stiction bumps 18. For example, the electrode structure 12 may be formed without anti-stiction bumps like the electrode structure $12_2$ of MEMS device 100. Alternatively, one or more of the plurality of anti-stiction bumps $18_{i+1}$ to $18_j$ may be formed at the electrode structure $12_2$, for example, directed towards the electrode structure 14.

Complementary to the MEMS device 100, the electrode structure 14 may comprise the opening in the main surface region $28_2$. Although the openings $34_1$, $34_2$ and 62 of MEMS devices 100 and 110 may be combined, having at least one electrode structure $12_1$, 14 or $12_2$ having at most the ventilation holes, allows to prevent an acoustic short-circuit or a low sensitivity of the MEMS device.

In other words, FIG. 11 shows a version with a double backplate structure having no membrane in the center.

Figure 12:
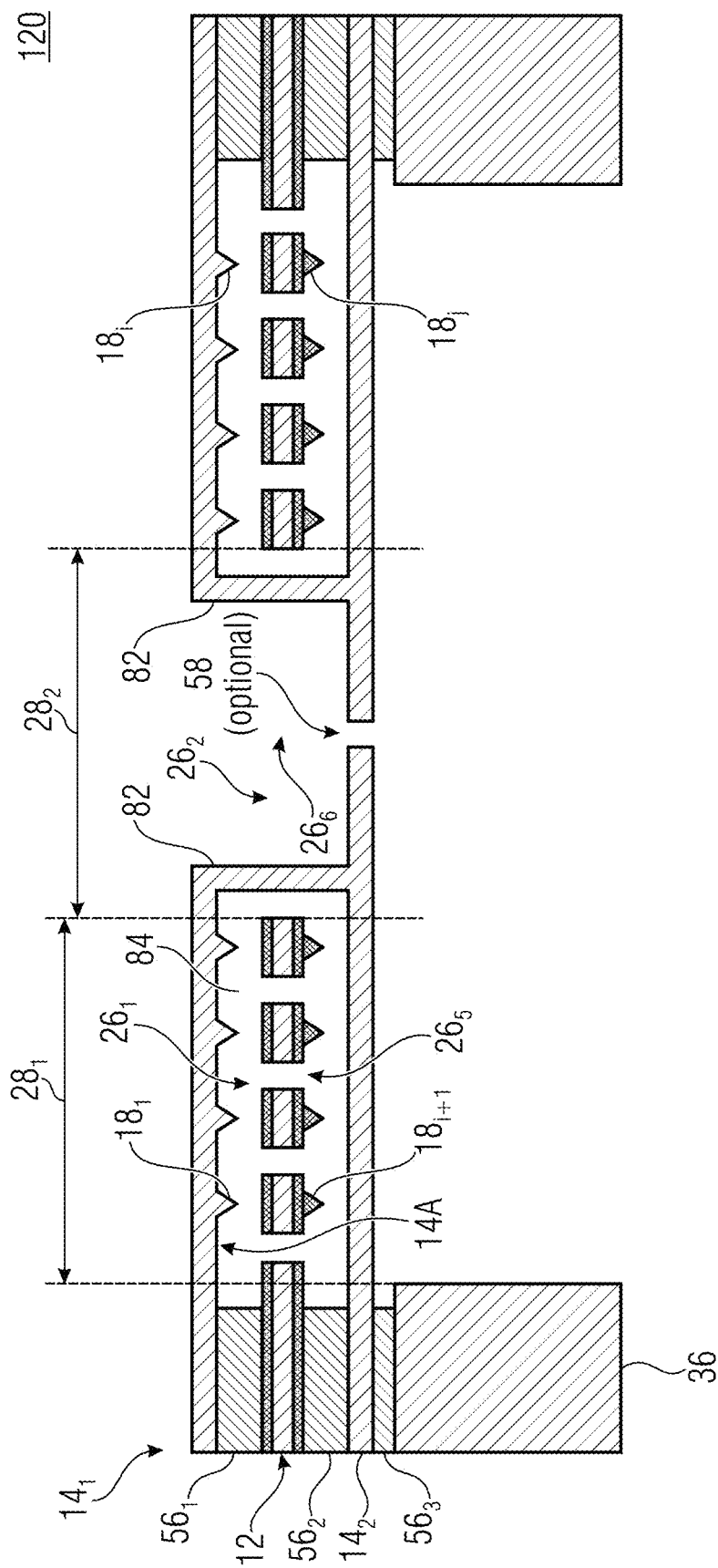
FIG. 12 shows a schematic side view of a MEMS device according to an embodiment being implemented as dual-membrane structure, a first membrane having an opening at the center.

FIG. 12 shows a schematic side view of a MEMS device 120 according to an embodiment. When compared to the MEMS devices 100 and 110, the MEMS device 120 may be formed as a so-called double membrane structure having electrode structures $14_1$ and $14_2$ formed as flexible membrane structures sandwiching the electrode structure 12 providing for a backplate structure. That is, the electrode structure 12 is arranged between the electrode structures $14_1$ and $14_2$. For example, anti-stiction bumps $18_1$ to $18_i$ and $18_{i+1}$ to $18_j$ are arranged at the electrode structure $14_1$, 12 respectively facing the electrode structure 12, $14_2$ respectively. A distribution density $26_5$ of the anti-stiction bumps $18_{i+1}$ to $18_j$ may be different or at least within a tolerance range of ±10%, ±5% or ±2% same as the distribution density $26_1$. Alternatively or in addition, a distribution density $26_6$ in the main surface region $28_2$ may be different or at least within a tolerance range of ±10%, ±5% or ±2% equal when compared to the distribution density $26_2$.

A connecting structure 82 may provide for a mechanical and optionally an electrical connection between the electrode structures $14_1$ and $14_2$. This allows to house a volume 84 between the electrode structures $14_1$ and $14_2$ which allows to provide for pressures or environments being different when compared to an outside world in the volume 84. For example, in the volume 84, there may be a low pressure or even a pressure close to a vacuum so as to minimize mechanical work by transporting a fluid between both sides of the electrode structure 12.

Figure 13:
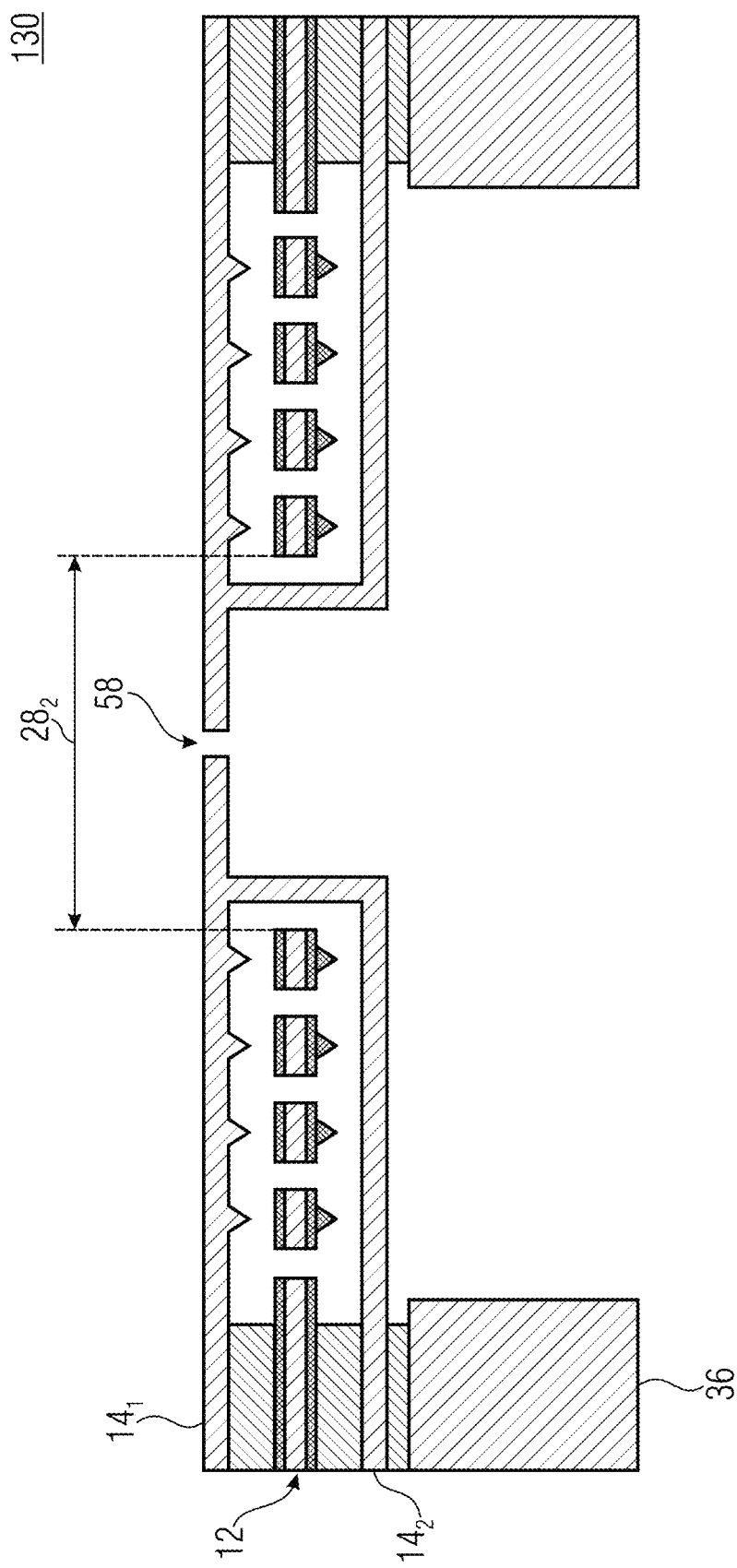
FIG. 13 shows a schematic side view of a MEMS device according to an embodiment being implemented as dual-membrane structure, a second membrane having an opening at the center.

It may be sufficient to have only one of the electrode structures $14_1$ and $14_2$ being implemented in the main surface region $28_2$. I.e., optionally, one of the electrode structures $14_1$ and $14_2$ may be absent in the main surface region $28_2$. Optionally, one or more ventilation holes 58 may be arranged in the remaining electrode structure $14_1$ and/or $14_2$ in the main surface region $28_2$. FIG. 13 shows a schematic side view of a MEMS device 130 according to an embodiment. When compared to the MEMS device 120, the electrode structure $14_1$ is present in the main surface region $28_2$, wherein the electrode structure $14_2$ is removed in at least 70%, 80% or 90% of the main surface region $28_2$, for example, completely removed.

In other words, MEMS devices 120 and 130 provide for versions with a dual membrane whilst having only the top or the bottom membrane in the main surface region $28_2$.

Embodiments described herein allow to increase the mechanical robustness of a MEMS microphone. In particular, embodiments allow for withstand high forces leading to abutments between electrode structures which may lead to a highly destructive stress generated on the membrane due to anti-stiction bumps. This allows to prevent damages as a membrane may be sensitive for such forces induced when the MEMS faces high loads, e.g., high pressures. Such effects may be reduced or even be prevented with the embodiments described herein.

Embodiments provide for a MEMS, for example, a MEMS microphone having at least one membrane and at least one backplate for a capacitive measurement of motion of the membrane due to sound pressure or other forces. Anti-stiction bumps may be arranged between the electrodes. The MEMS may have a possibly central are that may correspond to the position of the port hole in the package, wherein no or at least a reduced number of anti-stiction bumps is present between the electrodes in this region. Alternatively or in addition, no backplate(s) may be arranged in the respective region, e.g., the center of the area. Alternatively or in addition, no membrane may be arranged in the respective region. In both cases, the backplate structure may have a low perforation rate in the central part or even just few holes or no holes, to control the ventilation between the outside pressure and the back volume of the package.

Alternatively or in addition, the at least one backplate structure may be present in the center area, but the central part is connected to a same potential as the membrane so that bumps can be removed but no force is existing between the central part of the membrane and the one of the backplate structure. For example, the membrane and the central part of the backplate structure may be connected to a constant voltage in a range of at least 5 volts and at most 20 volts, while the readout is done on the peripheral part of the backplate, i.e., the remaining portion 66. In this case, one option is to have a central anchor, e.g., the anchor structure 74 of the membrane to the backplate so that the maximum motion of the membrane occurs aside of the center in an area closer to the border, i.e., the substrate structure 36.

Alternatively or in addition, only the insulating material, e.g., nitride material, of the backplate is present in the center, whilst conductive material is missing. This allows that no electrostatic force is present and bumps can be suppressed without risk of stiction.

Alternatively or in addition, a dual membrane structure may be implemented as illustrated in FIG. 12 and in FIG. 13, this allows to have only the bottom membrane or the top membrane present in the main surface region $28_2$. According to a further embodiment, both membrane structures may be absent. According to an embodiment that is compatible with such a structure, the backplate may be present in the main surface area. In this case, the backplate may have a low perforation rate in the central part, or even just few holes or no holes, to control the ventilation between the outside pressure and the pressure in the back volume of the package.

FIG. 14 shows a schematic flowchart of a method 1400 according to an embodiment. At $14_{10}$, a capacitive sensing arrangement with a first electrode structure and a second electrode structure is formed. At $14_{20}$, a plurality of anti-stiction bumps is arranged between the first electrode structure and the second electrode structure at a corresponding plurality of locations such that the plurality of locations being projected into a main surface of the second electrode structure is distributed so as to comprise a first distribution density in a first main surface region of the main surface and so as to comprise a second, different distribution density in a second main surface region of the main surface, the second main surface region being delimited from the first main surface region.

According to a first aspect there is a MEMS device comprising:

a first electrode structure and a second electrode structure forming a capacitive sensing arrangement;

a plurality of anti-stiction bumps arranged between the first electrode structure and the second electrode structure at a corresponding plurality of locations;

wherein the plurality of locations being projected into a main surface of the second electrode structure is distributed so as to comprise a first distribution density in a first main surface region of the main surface and so as to comprise a second, different distribution density in a second main surface region of the main surface, the second main surface region being delimited from the first main surface region.

According to a second aspect in accordance with the first aspect, there is a MEMS device wherein the second distribution density is smaller than the first distribution density, in particular is zero.

According to a third aspect in accordance with the first and/or second aspect, there is a MEMS device wherein the anti-stiction bumps are arranged at the first electrode structure, wherein the first electrode structure comprises an opening forming at least a part of the second main surface region.

According to a fourth aspect in accordance with one of the previous aspects, there is a The MEMS device wherein the first electrode structure is a backplate structure, wherein at least a part of the plurality of ant-stiction bumps is arranged at the backplate structure; and wherein the backplate structure comprises a first backplate area and a second backplate area being electrically insulated from the first backplate area, the second backplate area at least partially forming the second main surface region; or wherein the backplate structure comprises a first backplate area being electrically conductive and a second backplate area being electrically non-conductive, the second backplate area at least partially forming the second main surface region.

According to a fifth aspect in accordance with one of the previous aspects, there is a MEMS device wherein the second electrode structure comprises an opening forming at least a part of the second main surface area and having a diameter of at least 100 μm According to a sixth aspect in accordance with one of the previous aspects, there is a MEMS device wherein the first electrode structure is a first backplate structure, the MEMS device further comprising a second backplate structure arranged such that the second electrode structure being a membrane structure is arranged between the first backplate structure and the second backplate structure; wherein the plurality of anti-stiction bumps is a first plurality of anti-stiction bumps, a second plurality of anti-stiction bumps arranged between the membrane structure and the second backplate structure at a corresponding second plurality of locations;

wherein the second plurality of locations being projected into the main surface of the membrane structure is distributed so as to comprise a third distribution density in the first main surface region of the main surface and so as to comprise a fourth, different distribution density in the second main surface region of the main surface.

According to a seventh aspect in accordance with the sixth aspect, there is a MEMS device wherein the second and fourth distribution density is equal within a tolerance range of ±10%.

According to an eight aspect in accordance with the sixth or seventh aspect, there is a MEMS device wherein the first backplate structure and the second backplate structure comprise a respective opening in locations corresponding to the second main surface area.

According to a ninth aspect in accordance with one of the first to fifth aspects, there is a MEMS device wherein the second electrode structure is a first membrane structure, the MEMS device further comprising a second membrane structure arranged such that the first electrode structure being a backplate structure is arranged between the first membrane structure and the second membrane structure; wherein the plurality of anti-stiction bumps is a first plurality of anti-stiction bumps, a second plurality of anti-stiction bumps arranged between the backplate structure and the second membrane structure at a corresponding second plurality of locations;

wherein the second plurality of locations being projected into the main surface of the first membrane structure is distributed so as to comprise a fifth distribution density in the first main surface region of the main surface and so as to comprise a sixth, different distribution density in the second main surface region of the main surface.

According to a tenth aspect in accordance with the ninth aspect, there is a MEMS device wherein the second and sixth distribution density is equal within a tolerance range of ±10%.

According to an eleventh aspect in accordance with one of the previous aspects the second main surface region of the main surface is located in a central area of the second electrode structure.

According to a twelfth aspect in accordance with one of the previous aspects, there is a MEMS device further comprising a housing, the housing comprising an opening between an inner volume of the MEMS device and an outside of the housing of the MEMS device, wherein the opening is arranged such that a location of the opening of the housing projected into the main surface on the one hand and the second main surface region on the other hand overlap at least partially.

According to a thirteenth aspect in accordance with the eleventh aspect, there is a MEMS device wherein a location of the second main surface region and the location of the opening of the housing correspond to each other within a tolerance range of ±20% and/or wherein a size of the second main surface region and a size of the opening of the housing correspond to each other within a tolerance range of ±20%.

According to a fourteenth aspect in accordance with the eleventh or twelfth aspect, there is a MEMS device wherein the location of the opening of the housing of the MEMS device projected into the main surface forms a part of the second main surface region or forms the second main surface region.

According to a fifteenth aspect in accordance with one of the previous aspects, there is a MEMS device wherein the MEMS device is a MEMS microphone.

According to a sixteenth aspect there is a method for producing a MEMS device, the method comprising:

forming a capacitive sensing arrangement with a first electrode structure and a second electrode structure;

arranging a plurality of anti-stiction bumps between the first electrode structure and the second electrode structure at a corresponding plurality of locations;

such that the plurality of locations being projected into a main surface of the second electrode structure is distributed so as to comprise a first distribution density in a first main surface region of the main surface and so as to comprise a second, different distribution density in a second main surface region of the main surface, the second main surface region being delimited from the first main surface region.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A MEMS device comprising:
a first electrode structure and a second electrode structure forming a capacitive sensing arrangement; and
a plurality of anti-stiction bumps arranged between the first electrode structure and the second electrode structure at a corresponding plurality of locations;
wherein the plurality of locations being projected into a main surface of the second electrode structure is distributed so as to comprise a first distribution density in a first main surface region of the main surface and so as to comprise a second, different distribution density in a second main surface region of the main surface, the second main surface region being delimited from the first main surface region,
wherein the first electrode structure is a backplate structure, wherein at least a part of the plurality of anti-stiction bumps is arranged at the backplate structure, and
wherein the backplate structure comprises a first backplate area and a second backplate area being electrically insulated from the first backplate area, the second backplate area at least partially forming the second main surface region, or
wherein the backplate structure comprises a first backplate area being electrically conductive and a second backplate area being electrically non-conductive, the second backplate area at least partially forming the second main surface region.

2. The MEMS device of claim 1, wherein the anti-stiction bumps are arranged at the first electrode structure, wherein the first electrode structure comprises an opening forming at least a part of the second main surface region.

3. The MEMS device of claim 1, wherein the second electrode structure comprises an opening forming at least a part of a second main surface area and having a diameter of at least 100 μm.

4. The MEMS device of claim 1, further comprising a second backplate structure arranged such that the second electrode structure being a membrane structure is arranged between the first backplate structure and the second backplate structure; wherein the plurality of anti-stiction bumps is a first plurality of anti-stiction bumps, a second plurality of anti-stiction bumps arranged between the membrane structure and the second backplate structure at a corresponding second plurality of locations; and
wherein the second plurality of locations being projected into the main surface of the membrane structure is distributed so as to comprise a third distribution density in the first main surface region of the main surface and so as to comprise a fourth, different distribution density in the second main surface region of the main surface.

5. The MEMS device of claim 4, wherein the second and fourth distribution density is equal within a tolerance range of ±10%.

6. The MEMS device of claim 4, wherein the first backplate structure and the second backplate structure comprise a respective opening in locations corresponding to a second main surface area.

7. The MEMS device of claim 1, wherein the second electrode structure is a first membrane structure, the MEMS device further comprising a second membrane structure arranged such that the first electrode structure being a backplate structure is arranged between the first membrane structure and the second membrane structure; wherein the plurality of anti-stiction bumps is a first plurality of anti-stiction bumps, a second plurality of anti-stiction bumps arranged between the backplate structure and the second membrane structure at a corresponding second plurality of locations; and
wherein the second plurality of locations being projected into the main surface of the first membrane structure is distributed so as to comprise a fifth distribution density in the first main surface region of the main surface and so as to comprise a sixth, different distribution density in the second main surface region of the main surface.

8. The MEMS device of claim 1, wherein the second and sixth distribution density is equal within a tolerance range of ±10%.

9. The MEMS device of claim 1, further comprising a housing, the housing comprising an opening between an inner volume of the MEMS device and an outside of the housing of the MEMS device, wherein the opening is arranged such that a location of the opening of the housing projected into the second main surface region overlap at least partially.

10. The MEMS device of claim 9, wherein a location of the second main surface region and the location of the opening of the housing correspond to each other within a tolerance range of ±20% and/or wherein a size of the second main surface region and a size of the opening of the housing correspond to each other within a tolerance range of ±20%.

11. The MEMS device of claim 9, wherein a width of the second main surface region is greater than a width of the opening of the housing of the MEMS device.

12. The MEMS device of claim 9, wherein the MEMS device is a MEMS microphone.

13. The MEMS device of claim 1, wherein the second distribution density is zero.

14. A MEMS device comprising:
a first electrode structure and a second electrode structure forming a capacitive sensing arrangement; and
a plurality of anti-stiction bumps arranged between the first electrode structure and the second electrode structure at a corresponding plurality of locations;
wherein the plurality of locations being projected into a main surface of the second electrode structure is distributed so as to comprise a first distribution density in a first main surface region of the main surface and so as to comprise a second, different distribution density in a second main surface region of the main surface, the second main surface region being delimited from the first main surface region, wherein the second distribution density is smaller than the first distribution density, wherein the second main surface region of the main surface is located in a central area of the second electrode structure and wherein the second main surface region has a width greater than a distance between two adjacent locations of the plurality of locations in the first main surface region, wherein the first electrode structure is a backplate structure, wherein at least a part of the plurality of anti-stiction bumps is arranged at the backplate structure, and wherein the backplate structure comprises a first backplate area and a second backplate area being electrically insulated from the first backplate area, the second backplate area at least partially forming the second main surface region, or wherein the backplate structure comprises a first backplate area being electrically conductive and a second backplate area being electrically non-conductive, the second backplate area at least partially forming the second main surface region.

15. A method for producing a MEMS device, the method comprising:

forming a capacitive sensing arrangement with a first electrode structure and a second electrode structure;

arranging a plurality of anti-stiction bumps between the first electrode structure and the second electrode structure at a corresponding plurality of locations;

such that the plurality of locations being projected into a main surface of the second electrode structure is distributed so as to comprise a first distribution density in a first main surface region of the main surface and so as to comprise a second, different distribution density in a second main surface region of the main surface, the second main surface region being delimited from the first main surface region, wherein the second distribution density is smaller than the first distribution density, wherein the second main surface region of the main surface is located in a central area of the second electrode structure and wherein the second main surface region has a width greater than a distance between two adjacent locations of the plurality of locations in the first main surface region, wherein the first electrode structure is a backplate structure, wherein at least a part of the plurality of anti-stiction bumps is arranged at the backplate structure, and wherein the backplate structure comprises a first backplate area and a second backplate area being electrically insulated from the first backplate area, the second backplate area at least partially forming the second main surface region, or wherein the backplate structure comprises a first backplate area being electrically conductive and a second backplate area being electrically non-conductive, the second backplate area at least partially forming the second main surface region.

16. A MEMS device comprising:

a first electrode structure and a second electrode structure forming a capacitive sensing arrangement; and a plurality of anti-stiction bumps arranged between the first electrode structure and the second electrode structure at a corresponding plurality of locations;

wherein the plurality of locations being projected into a main surface of the second electrode structure is distributed so as to comprise a first distribution density in a first main surface region of the main surface and so as to comprise a second, different distribution density in a second main surface region of the main surface, the second main surface region being delimited from the first main surface region, and wherein the second electrode structure comprises an opening forming at least a part of a second main surface area and having a diameter of at least 100 μm.

17. A MEMS device comprising:

a first electrode structure and a second electrode structure forming a capacitive sensing arrangement; and a plurality of anti-stiction bumps arranged between the first electrode structure and the second electrode structure at a corresponding plurality of locations;

wherein the plurality of locations being projected into a main surface of the second electrode structure is distributed so as to comprise a first distribution density in a first main surface region of the main surface and so as to comprise a second, different distribution density in a second main surface region of the main surface, the second main surface region being delimited from the first main surface region, wherein the second electrode structure is a first membrane structure, the MEMS device further comprising a second membrane structure arranged such that the first electrode structure being a backplate structure is arranged between the first membrane structure and the second membrane structure; wherein the plurality of anti-stiction bumps is a first plurality of anti-stiction bumps, a second plurality of anti-stiction bumps arranged between the backplate structure and the second membrane structure at a corresponding second plurality of locations, and wherein the second plurality of locations being projected into the main surface of the first membrane structure is distributed so as to comprise a fifth distribution density in the first main surface region of the main surface and so as to comprise a sixth, different distribution density in the second main surface region of the main surface.

* * * * *